United States Patent
Kim et al.

(10) Patent No.: US 11,316,005 B2
(45) Date of Patent: *Apr. 26, 2022

(54) DISPLAY DEVICE HAVING A BENDING AREA

(71) Applicant: SAMSUNG DISPLAY CO., LTD., Yongin-si (KR)

(72) Inventors: Yangwan Kim, Yongin-si (KR); Sunja Kwon, Yongin-si (KR); Byungsun Kim, Yongin-si (KR); Hyunae Park, Yongin-si (KR); Sujin Lee, Yongin-si (KR); Jaeyong Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/080,618

(22) Filed: Oct. 26, 2020

(65) Prior Publication Data

US 2021/0043718 A1 Feb. 11, 2021

Related U.S. Application Data

(63) Continuation of application No. 16/573,601, filed on Sep. 17, 2019, now Pat. No. 10,818,746, which is a (Continued)

(30) Foreign Application Priority Data

Mar. 31, 2016 (KR) .................. 10-2016-0039524

(51) Int. Cl.
*H01L 27/32* (2006.01)
*H01L 51/00* (2006.01)
(Continued)

(52) U.S. Cl.
CPC ........ *H01L 27/3279* (2013.01); *G02F 1/1345* (2013.01); *H01L 27/3262* (2013.01);
(Continued)

(58) Field of Classification Search
CPC ... H01L 27/12; H01L 27/121; H01L 27/1218; H01L 27/124; H01L 27/32; H01L 27/326;
(Continued)

(56) References Cited

U.S. PATENT DOCUMENTS 9,535,522 B2    1/2017  Ahn
10,424,631 B2   9/2019  Kim et al.
(Continued)

FOREIGN PATENT DOCUMENTS

EP     2889866       7/2015
KR     10-0671660    1/2007
KR     1020160019885 2/2016

OTHER PUBLICATIONS

European Search Report dated Aug. 8, 2017 is corresponding European Patent Application No. 17164267.1 (17 pages).
(Continued)

*Primary Examiner* — Monica D Harrison
(74) *Attorney, Agent, or Firm* — F. Chau & Associates, LLC

(57) ABSTRACT

A display device includes a substrate including a bending area located between a first area and a second area. The substrate is bent in relation to a bending axis. A first wiring unit including a plurality of first wirings is arranged on the substrate to sequentially extend over the first area, the bending area, and the second area. First central axes included in each of the plurality of first wirings are spaced apart from each other by a first pitch in the bending area. A second wiring unit including a plurality of second wirings is arranged on the substrate to sequentially extend over the first
(Continued)

area, the bending area, and the second area. Second central axes included in each of the plurality of second wirings are spaced apart from each other by a second pitch greater than the first pitch in the bending area.

21 Claims, 12 Drawing Sheets

Related U.S. Application Data continuation of application No. 15/467,088, filed on Mar. 23, 2017, now Pat. No. 10,424,631.

(51) Int. Cl.
    *G02F 1/1345*     (2006.01)
    *H01L 51/52*     (2006.01)
    *G02F 1/1333*     (2006.01)
    *H01L 27/12*     (2006.01)

(52) U.S. Cl.
    CPC .......... *H01L 51/0097* (2013.01); *H01L 51/52* (2013.01); *G02F 1/133305* (2013.01); *H01L 27/124* (2013.01); *H01L 27/1218* (2013.01); *H01L 2251/5338* (2013.01)

(58) Field of Classification Search
    CPC ............... H01L 27/3262; H01L 27/327; H01L 27/3279; H01L 2251/5338; H01L 51/00; H01L 51/009; H01L 51/0097; H01L 51/52; G02F 1/1345; G02F 1/133305
    USPC .......................................................... 257/72
    See application file for complete search history.

(56) References Cited

U.S. PATENT DOCUMENTS

| | | | |
|---|---|---|---|
| 10,818,746 B2* | 10/2020 | Kim | .................... H01L 27/3276 |
| 2016/0066409 A1 | 3/2016 | Kwon et al. | |
| 2017/0288009 A1 | 10/2017 | Kim et al. | |
| 2020/0013851 A1 | 1/2020 | Kim et al. | |

OTHER PUBLICATIONS

European Office Action dated Jul. 17, 2019 is corresponding European Patent Application No. 17164267.1 (6 pages).

* cited by examiner

DISPLAY DEVICE HAVING A BENDING AREA

CROSS-REFERENCE TO RELATED APPLICATION

This application is a Continuation of U.S. patent application Ser. No. 16/573,601, filed on Sep. 17, 2019, which is a Continuation of U.S. patent application Ser. No. 15/467,088, filed on Mar. 23, 2017, now U.S. Pat. No. 10,424,631, issued on Sep. 24, 2019, which claims priority under 35 U.S.C. § 119 to Korean Patent Application No. 10-2016-0039524, filed on Mar. 31, 2016, in the Korean Intellectual Property Office, the disclosures of which are incorporated by reference herein in their entirety.

1. TECHNICAL FIELD

Exemplary embodiments of the present invention relate to a display device, and more particularly, to a display device having a bending area.

2. DISCUSSION OF RELATED ART

In general, a display device may include a display over a substrate. Such a display device may be bent at least partially, thus increasing visibility from various angles or reducing an area of a non-display area.

SUMMARY

One or more exemplary embodiments of the present invention include a display device, which may reduce or eliminate an occurrence of defects, such as a disconnection, during manufacturing of the display device while increasing a lifespan of the display device. However, exemplary embodiments of the present invention are not limited thereto.

According to one or more exemplary embodiments of the present invention, a display device includes a substrate including a bending area located between a first area and a second area. The substrate is bent in relation to a bending axis. A first wiring unit including a plurality of first wirings is arranged on the substrate to sequentially extend over the first area, the bending area, and the second area. First central axes included in each of the plurality of first wirings are spaced apart from each other by a first pitch in the bending area. A second wiring unit including a plurality of second wirings is arranged on the substrate to sequentially extend over the first area, the bending area, and the second area. Second central axes included in each of the plurality of second wirings are spaced apart from each other by a second pitch greater than the first pitch in the bending area.

The plurality of first wirings and the plurality of second wirings may be substantially parallel with each other.

The plurality of first wirings and the plurality of second wirings may extend in a direction crossing the bending axis.

The second pitch may be n times as wide as the first pitch, $n \geq 2$, and n may be a natural number.

The second pitch may at least two times as wide as the first pitch.

The plurality of respective second central axes of the plurality of second wirings may be spaced apart from each other by a pitch narrower than the second pitch in the first area and the second area.

Each of the plurality of first wirings may have a first width, and each of the plurality of second wirings may have a second width greater than the first width.

Facing edges of each of the plurality of first wirings may be spaced apart from each other by a first distance, and facing edges of each of the plurality of second wirings may be spaced apart from each other by a second distance that is substantially the same as the first distance.

Each of the plurality of second wirings may include a first sub wiring and a second sub wiring that are spaced apart from each other by a predetermined distance. The first sub wiring and the second sub wiring may be electrically connected to each other.

Facing edges of each of the plurality of first wirings may be spaced apart from each other by a first distance, and facing edges of each of the plurality of second wirings may be spaced apart from each other by a second distance that is substantially the same as the first distance.

Each of the second wirings of the plurality of second wirings may be symmetrical to each other with respect to each of the plurality of second central axes.

The first sub wiring and the second sub wiring may be connected in parallel to each other.

Each of the plurality of second wirings may further include a third sub wiring spaced apart from the second sub wiring by a predetermined distance. The second sub wiring and the third sub wiring may be electrically connected to each other.

Resistance of each of the plurality of second wirings may be lower than resistance of each of the plurality of first wirings.

The display device may further include a pad unit located over the second area of the substrate.

The display device may include a display disposed over the substrate; and a driver disposed around the display and driving the display. The first wiring unit may be a data wiring unit providing a data signal to the display, and the second wiring unit may be a wiring unit supplying power to the driver or the display.

The display may be over the first area of the substrate.

The display device may include a thin film transistor disposed over the first area or the second area of the substrate and including a source electrode, a drain electrode, and a gate electrode. The first wiring unit may include a first conductive layer in the bending area and a second conductive layer in the first area and the second area. The first conductive layer may include a same material as the source electrode or the drain electrode, and the second conductive layer may include a same material as the gate electrode.

The first conductive layer and the second conductive layer may be electrically connected to each other via a contact hole.

The display device may include a thin film transistor disposed over the first area or the second area of the substrate and including a source electrode, a drain electrode, and a gate electrode. The second wiring unit may include a third conductive layer over the first area, the bending area, and the second area. The third conductive layer may be over the same layer as the source electrode or the drain electrode.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION

Figure 1:
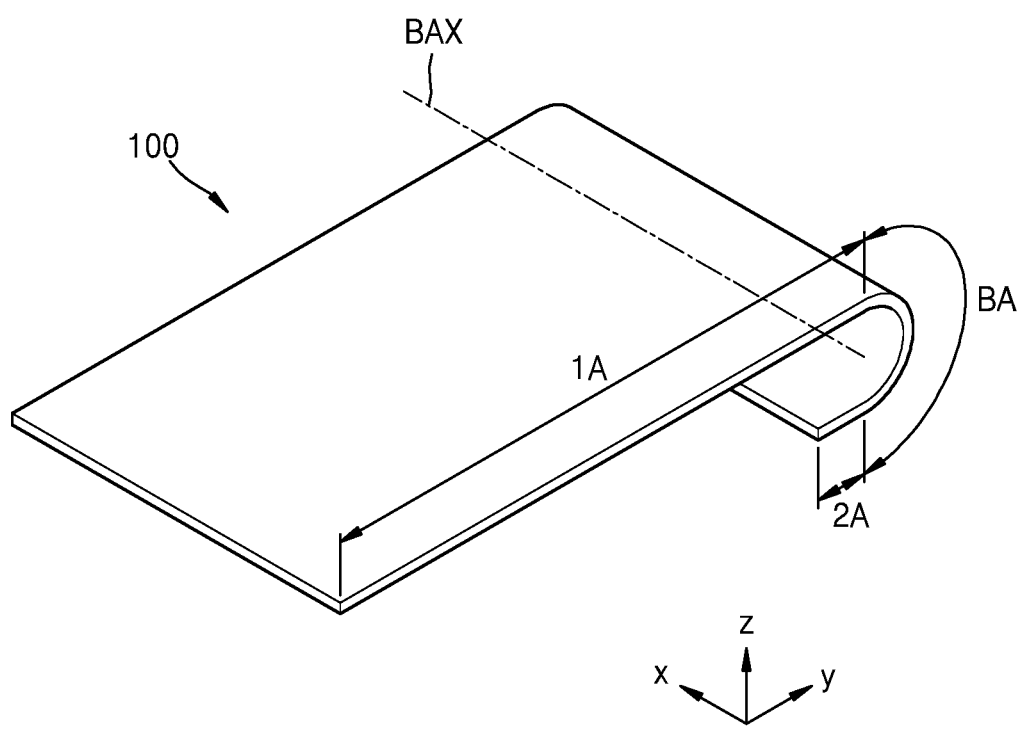
FIG. 1 is a schematic perspective view of a display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

It will be understood that although the terms "first" and "second" may be used herein to describe various components, these components should not be limited by these terms.

Sizes of elements in the drawings may be exaggerated for clarity of description.

According to some exemplary embodiments of the present invention, the x-axis, the y-axis and the z-axis are not limited to three axes of the rectangular coordinate system, and may be interpreted in a broader sense. For example, the x-axis, the y-axis, and the z-axis may be perpendicular to each other, or may represent different directions that are not perpendicular to each other.

Figure 2:
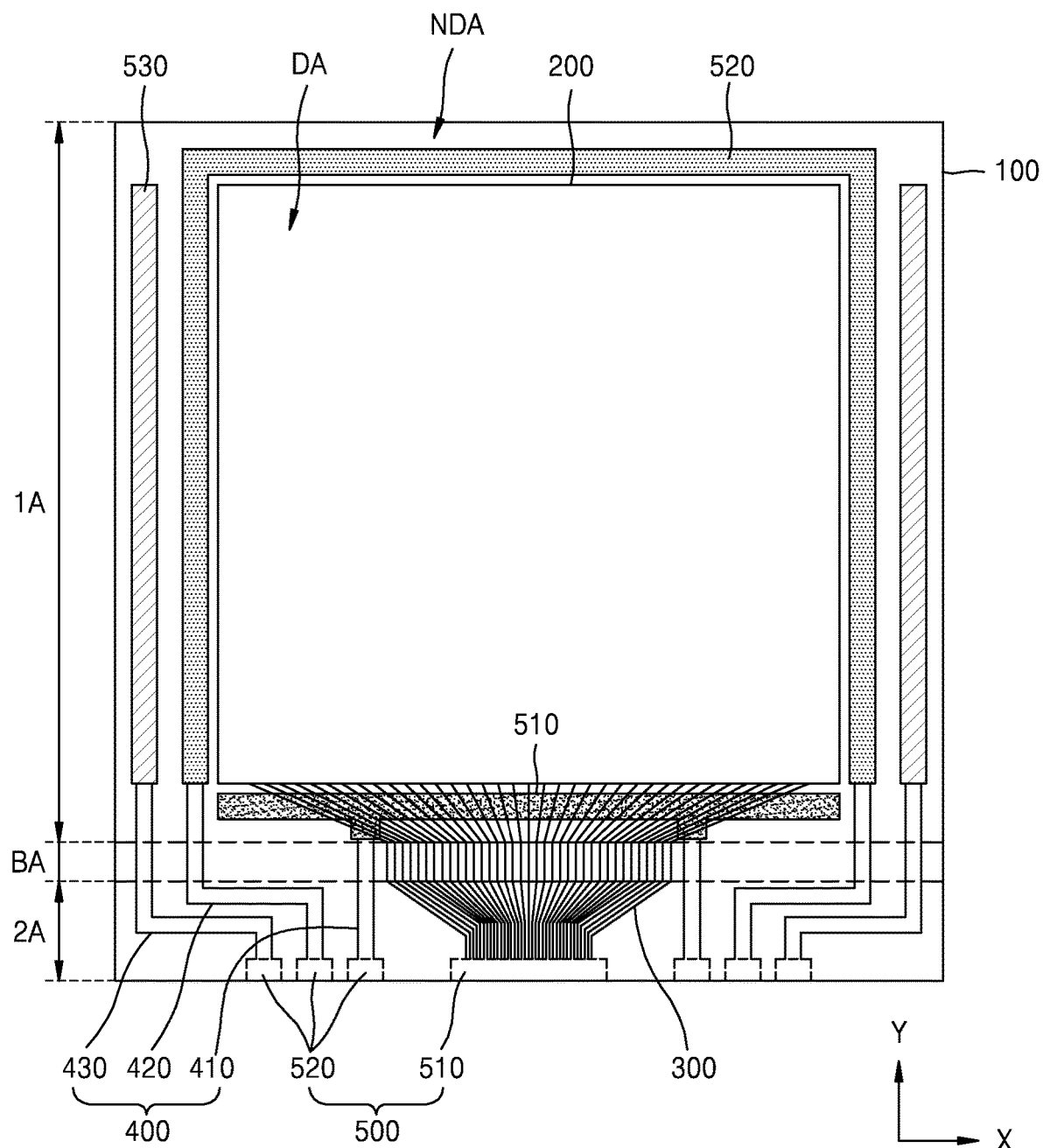
FIG. 2 is a schematic plan view of the display device of FIG. 1 that is not bent.

FIG. 1 is a schematic perspective view of a display device according to an embodiment exemplary embodiment of the present invention. FIG. 2 is a schematic plan view of the display device of FIG. 1 that is not bent.

A substrate 100 that is a part of the display device may be partially bent so that the display device has a partially bent shape. However, for clarity of description, FIG. 2 illustrates the display device that is not bent. Exemplary embodiments of the present invention described below in more detail with reference to FIGS. 2-11 may refer to the display device that is not bent.

Referring to FIGS. 1 and 2, the substrate 100 included in the display device may have a bending area BA extending in one direction (e.g., a +x direction). The bending area BA may be positioned between a first area 1A and a second area 2A in another direction (e.g., a +y direction) that intersects with the one direction (e.g., the +x direction). Referring to FIG. 1, the substrate 100 may be bent with respect to a bending axis BAX extending in the one direction (e.g., the +x direction).

The substrate 100 may include various materials having flexible or bendable characteristics. For example, the substrate 100 may include a polymer resin, such as polyethersulphone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), or cellulose acetate propionate (CAP).

The first area 1A may include a display area DA. Referring to FIG. 2, the first area 1A may include a part of a non-display area NDA outside the display area DA. The second area 2A may also include the non-display area NDA.

A display 200 may be disposed in the display area DA of the first area 1A. The display 200 may include a display device 250 and may display an image by controlling the display device 250 to emit light. A structure of the display 200 will be described below in more detail with reference to FIG. 7.

A first wiring unit 300 and a second wring unit 400 may be disposed over the substrate 100. The first wiring unit 300 and the second wiring unit 400 may be positioned over the non-display area NDA outside the display area DA, and may be sequentially disposed over the first area 1A, the second area 2A, and the bending area BA. At least a part of each of the first wiring unit 300 and the second wiring unit 400 may overlap with the bending area BA. Each of the first wiring unit 300 and the second wring unit 400 may be electrically connected to the display 200.

The first wiring unit 300 may be a wiring unit that transmits a data signal to the display 200. For example, the first wiring unit 300 may be a data line. The second wiring unit 400 may be spaced apart from the first wiring unit 300. The second wiring unit 400 may include a first power wiring unit 410 and a second power wiring unit 420 that supply driving power to the display 200, and a driving circuit wiring unit 430 applying a signal to a scan driving circuit 530. The first power wiring unit 410 and the second power wiring unit 420 may be referred to as a driver, and may drive the display. The scan driving circuit 530 may be a shift register. For example, the first power wiring unit 410 may be an ELVDD line, the second power wiring unit 420 may be an ELVSS line, and the driving circuit wiring unit 430 may be a scan line or a gate line.

Although the first wiring unit 300 and the first power wiring unit 410 of the second wiring unit 400 overlap with each other in the first area 1A in FIG. 2, the first wiring unit 300 and the first power wiring unit 410 of the second wiring unit 400 might not be electrically connected to each other. The first wiring unit 300 and the first power wiring unit 410 of the second wiring unit 400 may be separate layers in the first area 1A. The second wiring unit 400 may be formed over substantially the entire area of the substrate 100 and may include a same material as a source electrode 206a or a drain electrode 206b of a thin film transistor TFT that will be described in more detail below. The first wiring unit 300 may include a same material as a gate electrode 202 of the thin film transistor TFT disposed in the first area 1A and the second area 2A. The first wiring unit 300 may include a same material as the source electrode 206a or the drain electrode 206b of the thin film transistor TFT disposed in the bending area BA. Thus, layers of the first wiring unit 300 and the first power wiring unit 410 of the second wiring unit 400 may overlap each other in the first area 1A without being electrically connected to each other.

According to an exemplary embodiment of the present invention, the first wiring unit 300 and the second wring unit 400 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), calcium (Ca), titanium (Ti), tungsten (W), and copper (Cu). Each of the first wiring unit 300 and the second wring unit 400 may have a single-layered or multi-layered structure.

A pad unit 500 may overhang an edge of the substrate 100. A separate chip may be attached to the pad unit 500. The pad unit 500 may include a first pad unit 510 and a second pad unit 520. The first wiring unit 300 may be connected to the first pad unit 510, and the second wiring unit 400 may be connected to the second pad unit 520. A signal applied to the pad unit 500 may be provided to the display 200.

According to an exemplary embodiment of the present invention, the first wiring unit 300 may include a plurality of first wirings 300-1, 300-2, . . . (see, e.g., FIG. 3) that may be disposed over the substrate 100 to sequentially extend over the first area 1A, the bending area BA, and the second area 2A of the substrate 100. The plurality of first wirings 300-1, 300-2, . . . may be spaced apart from each other by a predetermined space.

The second wiring unit 400 may include a plurality of second wirings 400-1, 400-2, . . . (see, e.g., FIG. 3) that may be disposed over the substrate 100 to sequentially extend over the first area 1A, the bending area BA, and the second area 2A of the substrate 100. The plurality of second wirings 400-1, 400-2, . . . may be spaced apart from each other by a predetermined space. The second wiring unit 400 including the plurality of second wirings 400-1, 400-2, . . . may refer to the second wiring unit 400 including the first power wiring unit 410, the second power wiring unit 420, and the driving circuit wiring unit 430. In other words, the first power wiring unit 410, the second power wiring unit 420, or the driving circuit wiring unit 430 may each include a plurality of second wirings 400-1, 400-2, . . . . Thus, the plurality of second wirings 400-1, 400-2, . . . may refer to a plurality of wirings included in each of the first power wiring units 410, the second power wiring units 420 or the driving circuit wiring unit 430.

According to an exemplary embodiment of the present invention, spaces between the plurality of second wirings 400-1, 400-2, . . . may be greater than spaces between the plurality of first wirings 300-1, 300-2, . . . in at least some areas. Spaces between the plurality of second wirings 400-1, 400-2, . . . may refer to spaces between two adjacent second wirings 400-1, 400-2, . . . . The second wirings 400-1, 400-2, . . . will be described in more detail below with reference to FIG. 3.

Figure 3:
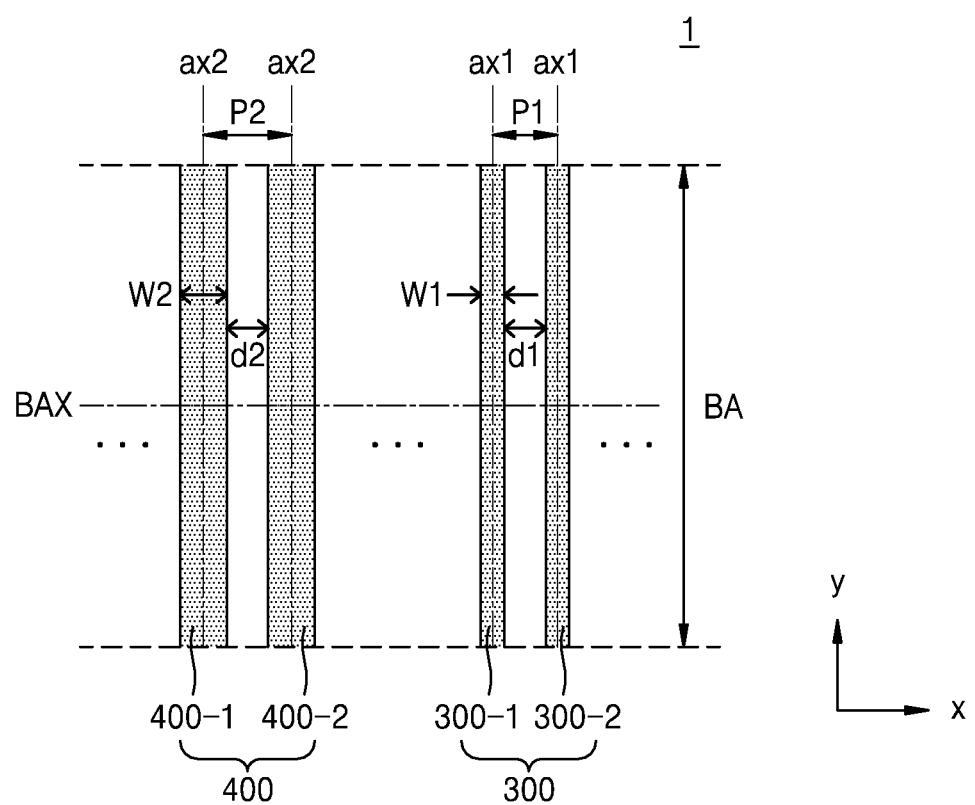
FIG. 3 is a schematic enlarged plan view of a part of the display device of FIG. 1.

FIG. 3 is a schematic enlarged plan view of a part of a display device of FIG. 1.

FIG. 3 schematically illustrates enlarged parts of the first wiring unit 300 and the second wiring unit 400 in the bending area BA. The plurality of second wirings 400-1, 400-2, . . . shown in FIG. 3 may be wirings of the first power wiring unit 410, wirings of the second power wiring unit, or wirings of the driving circuit wiring unit 430. FIG. 3 illustrates the two first wirings 300-1 and 300-2 that are most adjacent to each other among the plurality of first wirings 300-1, 300-2, . . . of the first wiring unit 300, and the two second wirings 400-1 and 400-2 that are most adjacent to each other among the plurality of second wirings 400-1, 400-2, . . . of the second wiring unit 400.

Referring to FIG. 3, the first wiring unit 300 may include the first wirings 300-1 and 300-2 that are most adjacent to each other. The first wirings 300-1 and 300-2 may respectively extend in one direction along first central axes ax. Each of the first central axes ax1 may cross a bending axis BAX. According to an exemplary embodiment of the present invention, each of the first central axes ax1 may be perpendicular to the bending axis BAX. For example, the bending axis BAX may be formed in an X axis direction, and the first central axes ax1 may be formed along a Y axis direction perpendicular to the X axis. According to an exemplary embodiment of the present invention, the first central axes ax1 may be formed in a diagonal direction crossing the X axis.

The second wiring unit 400 may include the second wirings 400-1 and 400-2 that are most adjacent to each other. The second wirings 400-1 and 400-2 may respectively extend in one direction along second central axes ax2. Each of the second central axes ax2 may cross the bending axis BAX. According to an exemplary embodiment of the present invention, each of the second central axes ax2 may be perpendicular to the bending axis BAX. For example, the bending axis BAX may be formed in the X axis direction, and the second central axes ax2 may be formed along the Y axis direction perpendicular to an X axis. According to an exemplary embodiment of the present invention, the second central axes ax2 may be formed in a diagonal direction crossing the X axis.

Referring to FIG. 3, the first wirings 300-1 and 300-2 and the second wirings 400-1 and 400-2 may be substantially parallel with each other in some areas. The first wirings 300-1 and 300-2 and the second wirings 400-1 and 400-2 may sequentially extend over the first area 1A, the bending BA, and the second area 2A of the substrate 100. The first wirings 300-1 and 300-2 and the second wirings 400-1 and 400-2 may be substantially parallel with each other in the bending area BA.

According to an exemplary embodiment of the present invention, the first central axes ax1 included in the first wirings 300-1 and 300-2 may be spaced apart from each other by a first pitch P1, and the second central axes ax2 included in the second wirings 400-1 and 400-2 may be spaced apart from each other by a second pitch P2. The first central axis ax1 may be an axis extending from centers of one side end and another side end of each of the first wirings 300-1 and 300-2 in a width direction. A location of the first central axis ax may be changed according to a pitch P1 between the first wirings 300-1 and 300-2. The pitch P1 will be described in more detail below. The second central axis ax2 may be similarly positioned. A second pitch P2 may be greater than the first pitch P1. That is, the plurality of second wirings 400-1 and 400-2 may be spaced apart from each other by a pitch greater than the first wirings 300-1 and 300-2. The first pitch P1 may refer to a distance between the first central axes ax1 of the first wirings 300-1 and 300-2 that are most adjacent to each other. The second pitch P2 may refer to a distance between the second central axes ax2 of the second wirings 400-1 and 400-2 that are most adjacent to each other.

According to an exemplary embodiment of the present invention, the second pitch P2 may be a times (e.g., n≥2) of the first pitch P. The second pitch P2 of the second wirings 400-1 and 400-2 may increase by a multiple of the first pitch P1 of the first wirings 300-1 and 300-2 and may increase by a multiple of a natural number except 1. When the second pitch P2 is n times (e.g., n≥2, 2 is a natural number) of the first pitch P1, the uniformity of wirings disposed over the substrate 100 may be increased, thus reducing or eliminating a critical dimension (CD) deviation between the wirings and simultaneously increasing productivity.

According to an exemplary embodiment of the present invention, the second pitch P2 may be 2 times or more the first pitch P. The second pitch P2 of the second wirings 400-1 and 400-2 may be 2 times or more the first pitch P1 of the first wirings 300-1 and 300-2 and need not increase by a multiple of the first pitch P1. In other words, the second pitch P2 of the second wirings 400-1 and 400-2 may be 2*a (e.g., a≥1) of the first pitch P1 of the first wirings 300-1 and 300-2 and "a" may be a rational number equal to or greater than 1. When the second pitch P2 is 2 times or more the first pitch P1, wirings may be disposed over the substrate 100.

According to an exemplary embodiment of the present invention, each of the first wirings 300-1 and 300-2 may have a first width w, and each of the second wirings 400-1 and 400-2 may have a second width w2. A width may be a thickness (width) recognizable on a plane (e.g., an X-Y plane) and may refer to a distance from one side end of a wiring to another side end of the wiring in relation to a central axis of the wiring. The width may refer to the distance from one side end of a wiring to another side end of the wiring along a width direction of the wiring. According to an exemplary embodiment of the present invention, the second width w2 of each of the second wirings 400-1 and 400-2 may be greater than the first width w1 of each of the first wirings 300-1 and 300-2. When viewed in a plan view, each of the second wirings 400-1 and 400-2 may be thicker than each of the first wirings 300-1 and 300-2. The second width w2 of each of the second wirings 400-1 and 400-2 may be greater than the first width w1 of each of the first wirings 300-1 and 300-2, and thus the second pitch P2 of the second wirings 400-1 and 400-2 may be greater than the first pitch P of the first wirings 300-1 and 300-2.

The second width w2 of each of the second wirings 400-1 and 400-2 may be greater than the first width w1 of each of the first wirings 300-1 and 300-2, and thus the resistance of each of the second wirings 400-1 and 400-2 may be less than the resistance of each of the first wirings 300-1 and 300-2. The second wiring unit 400 may include a power wiring unit and a driving circuit wiring unit, and thus the resistance of the second wiring unit 400 may be reduced, thus providing power and driving signals to each pixel of a display and accordingly increasing the quality of the display.

According to an exemplary embodiment of the present invention, the first wirings 300-1 and 300-2 may be spaced apart from each other by a first distance d1, and the second wirings 400-1 and 400-2 may be spaced apart from each other by a second distance d2. The first wirings 300-1 and 300-2 may be spaced apart from each other by the first distance d1 and a distance between facing edges of each of the first wirings 300-1 and 300-2 that are most adjacent to each other may be the first distance d1. This may also apply to the second wirings 400-1 and 400-2 that are spaced apart from each other by the second distance d2.

The first distance d1 and the second distance d2 may be substantially the same. The second distance d2 between the second wirings 400-1 and 400-2 may be substantially the same as the first distance d1 between the first wirings 300-1 and 300-2. Even if a width of each of the second wirings 400-1 and 400-2 increases, a minimum distance between the second wirings 400-1 and 400-2 may be maintained and thus shorts between wirings may be reduced or eliminated.

The substrate 100 may be bent along the bending axis BAX in the bending area BA, and thus tensile stress may be applied to the plurality of first wirings 300-1, 300-2, . . . and the plurality of second wirings 400-1, 400-2, . . . in the bending area BA. In this case, the first wiring unit 300 including data wirings may include a relatively large number of channels, and the second wiring unit 400 including the power wiring unit and the driving circuit wiring unit may include relatively fewer channels than the first wiring unit 300. Thus, the substrate 100 may be bent in the bending area BA, thus repeatedly and continuously applying tensile stress to the first wiring unit 300 and the second wiring unit 400. Bending of the substrate 100 in the bending area BA may causes cracks or defects due to disconnections in the plurality of first wirings 300-1, 300-2, . . . of the first wiring unit 300 and the plurality of second wirings 400-1, 400-2, . . . of the second wiring unit 400.

Since the second wiring unit 400 may include relatively fewer channels than the first wiring unit 300, a disconnection of one wiring of the second wiring unit 400 may be relatively more likely to cause a fatal defect. Since the second wiring unit 400 includes the power wiring unit and the driving circuit wiring unit, when a defect or a disconnection occurs in a power wiring or a driving circuit wiring, there may be a fatal defect where power is not supplied to the display or a signal is not applied to a driving signal for driving the display.

The display device 1 according to an exemplary embodiment of the present invention may have a pitch between the plurality of second wirings 400-1, 400-2, . . . of the second wiring unit 400 greater than a pitch between the plurality of first wirings 300-1, 300-2, . . . of the first wiring unit 300. The second pitch P2 between the plurality of second wirings 400-1, 400-2, . . . may be greater than the first pitch P between the plurality of first wirings 300-1, 300-2, . . . , thus reducing tensile stress applied to the second wiring unit 400 in the bending area BA of the substrate 100.

Figure 4:
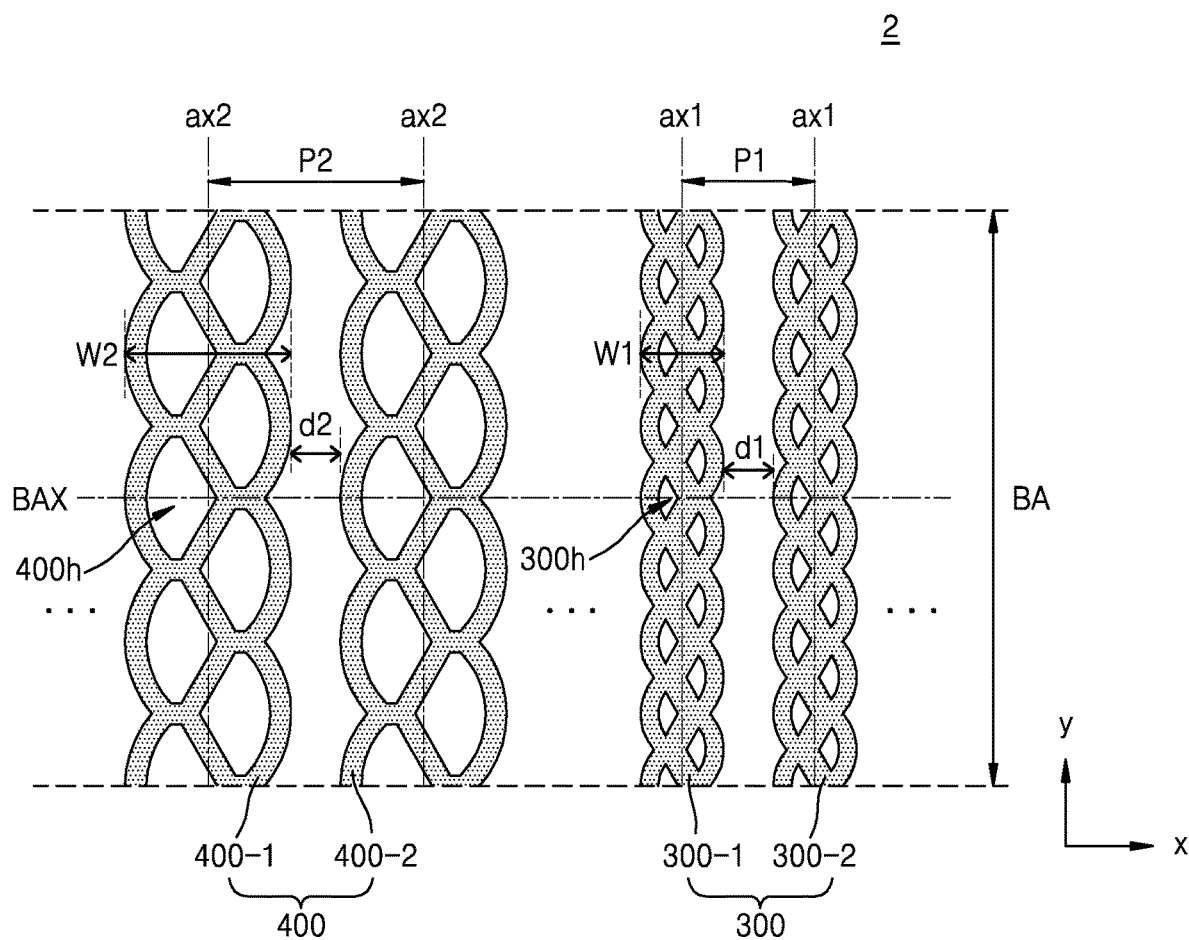
FIG. 4 is a schematic enlarged plan view of a part of a display device according to another exemplary embodiment of the present invention.

FIG. 4 is a schematic enlarged plan view of a part of a display device according to another exemplary embodiment of the present invention. A display device 2 is described in more detail below with reference to FIG. 4.

FIG. 4 schematically illustrates enlarged parts of the first wiring unit 300 and the second wiring unit 400 in the bending area BA. The second wirings 400-1 and 400-2 shown in FIG. 4 may be wirings of the first power wiring unit 410 of the second wiring unit 400, wirings of the second power wiring unit 420 thereof, or wirings of the driving circuit wiring unit 430. FIG. 4 illustrates the two first wirings 300-1 and 300-2 that are most adjacent to each other among the plurality of first wirings 300-1, 300-2, . . . of the first wiring unit 300, and the two second wirings 400-1 and 400-2 that are most adjacent to each other among the plurality of second wirings 400-1, 400-2, . . . of the second wiring unit 400.

Referring to FIG. 4, the first wirings 300-1 and 300-2 of the first wiring unit 300 and the second wirings 400-1 and 400-2 of the second wiring unit 400 may have shapes patterned on a plane. The first wirings 300-1 and 300-2 of the first wiring unit 300 and the second wirings 400-1 and 400-2 of the second wiring unit 400 may have a chain shape in which straight lines and curves cross and are connected to each other. The patterned first wirings 300-1 and 300-2 or second wirings 400-1 and 400-2 may be formed by making a plurality of through holes 300h and 400h having a fan shape alternately facing each other and making outer lines of wirings repeatedly along curves of the through holes 300h and 400h. However, exemplary embodiments of the present invention are not limited thereto. The plurality of through holes 300h and 400h may have various shapes such as a round shape of a fan-shaped cusp, an oval shape, a circular shape, or a polygonal shape, other than the fan shape.

Such a patterned shape may be selectively applied to only the first wiring unit 300 and the second wiring unit 400 in the bending area BA and, as another embodiment, may applied to substantially the entire surface of the substrate 100 including the bending area BA. The patterned shape of wirings may distribute tensile stress applied to the wirings in the bending area BA.

The first wiring unit 300 may include the first wirings 300-1 and 300-2. The first wirings 300-1 and 300-2 may respectively extend in one direction along the first central axes ax1. The second wiring unit 400 may include the second wirings 400-1 and 400-2. The second wirings 400-1 and 400-2 may respectively extend in one direction along the second central axes ax2. Each of the first central axes ax1 and the second central axes ax2 may cross the bending axis BAX. According to an exemplary embodiment of the present invention, each of the first central axes ax 1 and the second central axes ax2 may be perpendicular to the bending axis BAX. For example, the bending axis BAX may be formed in the X axis direction, and the first central axes ax1 and the second central axes ax2 may be formed along the Y axis direction perpendicular to the X axis. According to an exemplary embodiment of the present invention, the first central axes ax1 and the second central axes ax2 may be formed in a diagonal direction crossing the X axis. According to an exemplary embodiment of the present invention, the first central axes ax and the second central axes ax2 may extend along different directions.

Referring to FIG. 4, the first wirings 300-1 and 300-2 and the second wirings 400-1 and 400-2 may be substantially parallel with each other and may be disposed in some areas. That is, the first wirings 300-1 and 300-2 and the second wirings 400-1 and 400-2 may sequentially extend over the first area 1A, the bending BA, and the second area 2A of the substrate 100. The first wirings 300-1 and 300-2 and the second wirings 400-1 and 400-2 may be substantially parallel with each other in the bending area BA.

According to an exemplary embodiment of the present invention, the first central axes ax1 included in the first wirings 300-1 and 300-2 may be spaced apart from each other by the first pitch P1, and the second central axes ax2 included in the second wirings 400-1 and 400-2 may be spaced apart from each other by the second pitch P2. The first central axis ax1 is an axis extending from centers of one side end and another side end of each of the first wirings 300-1 and 300-2 in a width direction. A location of the first central axis ax1 may be changed according to a pitch between the first wirings 300-1 and 300-2. Referring to FIG. 4, when outer lines of the plurality of first wirings 300-1, 300-2, . . . have repetitive curved shapes, the centers of one side end and another side end of each of the first wirings 300-1 and 300-2 in the width direction may be centers of a protrusion from one side and a protrusion from another side. This may also apply to the second central axis ax2.

The second pitch P2 may be greater than the first pitch P1. The plurality of second wirings 400-1 and 400-2 may be spaced apart from each other by a pitch greater than the first wirings 300-1 and 300-2. The first pitch P1 may refer to a distance between the first central axes ax1 of the first wirings 300-1 and 300-2 that are most adjacent to each other. The second pitch P2 may refer to a distance between the second central axes ax2 of the second wirings 400-1 and 400-2 that are most adjacent to each other.

According to an exemplary embodiment of the present invention, the second pitch P2 may be n times (e.g., n≥2) of the first pitch P. The second pitch P2 of the second wirings 400-1 and 400-2 may increase by a multiple of the first pitch P1 of the first wirings 300-1 and 300-2 and may increase by a multiple of a natural number except 1. According to an exemplary embodiment of the present invention, the second pitch P2 may be 2 times or more the first pitch P1. The second pitch P2 of the second wirings 400-1 and 400-2 may be 2 times or more the first pitch P1 of the first wirings 300-1 and 300-2 and need not increase by a multiple of the first pitch P1. The second pitch P2 of the second wirings 400-1 and 400-2 may be 2*a (e.g., a≥1) of the first pitch P1 of the first wirings 300-1 and 300-2 and "a" may be a rational number equal to or greater than 1. Thus, wirings may be disposed over the substrate 100.

According to an exemplary embodiment of the present invention, each of the first wirings 300-1 and 300-2 may have the first width w1, and each of the second wirings 400-1 and 400-2 may have the second width w2. A width may be a thickness on a plane (e.g., the X-Y plane) and may refer to a distance from one side end of a wiring to another side end of the wiring in relation to a central axis of the wiring. The second width w2 of each of the second wirings 400-1 and 400-2 may be greater than the first width w1 of each of the first wirings 300-1 and 300-2. When viewed in a plan view, each of the second wirings 400-1 and 400-2 may be thicker than each of the first wirings 300-1 and 300-2. The second width w2 of each of the second wirings 400-1 and 400-2 may be greater than the first width w1 of each of the first wirings 300-1 and 300-2, and thus the second pitch P2 of the second wirings 400-1 and 400-2 may be greater than the first pitch P1 of the first wirings 300-1 and 300-2.

The second width w2 of each of the second wirings 400-1 and 400-2 may be greater than the first width w1 of each of the first wirings 300-1 and 300-2, and thus the resistance of each of the second wirings 400-1 and 400-2 may be less than the resistance of each of the first wirings 300-1 and 300-2. The second wiring unit 400 may include a power wiring unit and a driving circuit wiring unit, and thus the resistance of the second wiring unit 400 may be reduced, thus providing power and driving signals to each pixel of a display and accordingly increasing the quality of the display.

According to an exemplary embodiment of the present invention, the first wirings 300-1 and 300-2 may be spaced apart from each other by the first distance d1, and the second wirings 400-1 and 400-2 may be spaced apart from each other by the second distance d2. The first wirings 300-1 and 300-2 may be spaced apart from each other by the first distance d1, which may refer to a distance between facing edges of each of the first wirings 300-1 and 300-2 that are most adjacent to each other. This may also apply to the second wirings 400-1 and 400-2 that are spaced apart from each other by the second distance d2.

The first distance d1 and the second distance d2 may be substantially the same. The second distance d2 between the second wirings 400-1 and 400-2 may be substantially the same as the first distance d1 between the first wirings 300-1 and 300-2. Even if a width of each of the second wirings 400-1 and 400-2 increases, a minimum distance between the second wirings 400-1 and 400-2 may be maintained. Thus, shorts between wirings may be reduced or eliminated.

Figure 5:
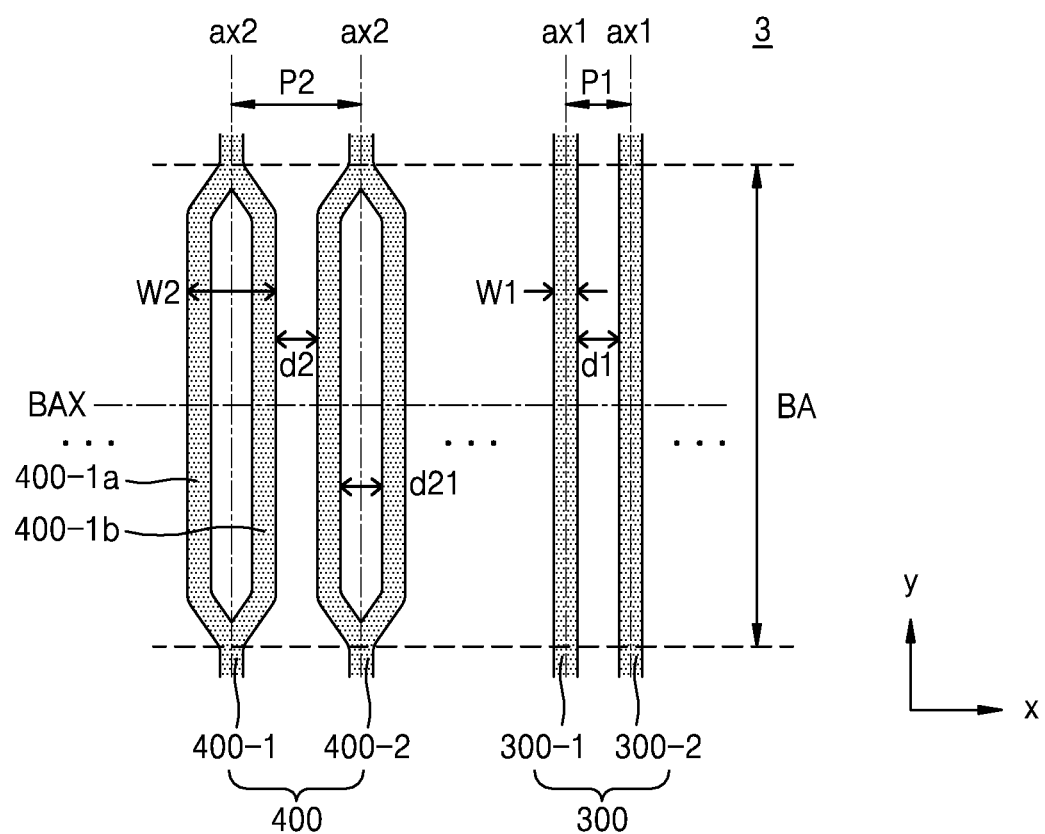
FIG. 5 is a schematic enlarged plan view of a part of a display device according to another exemplary embodiment of the present invention.
Figure 6:
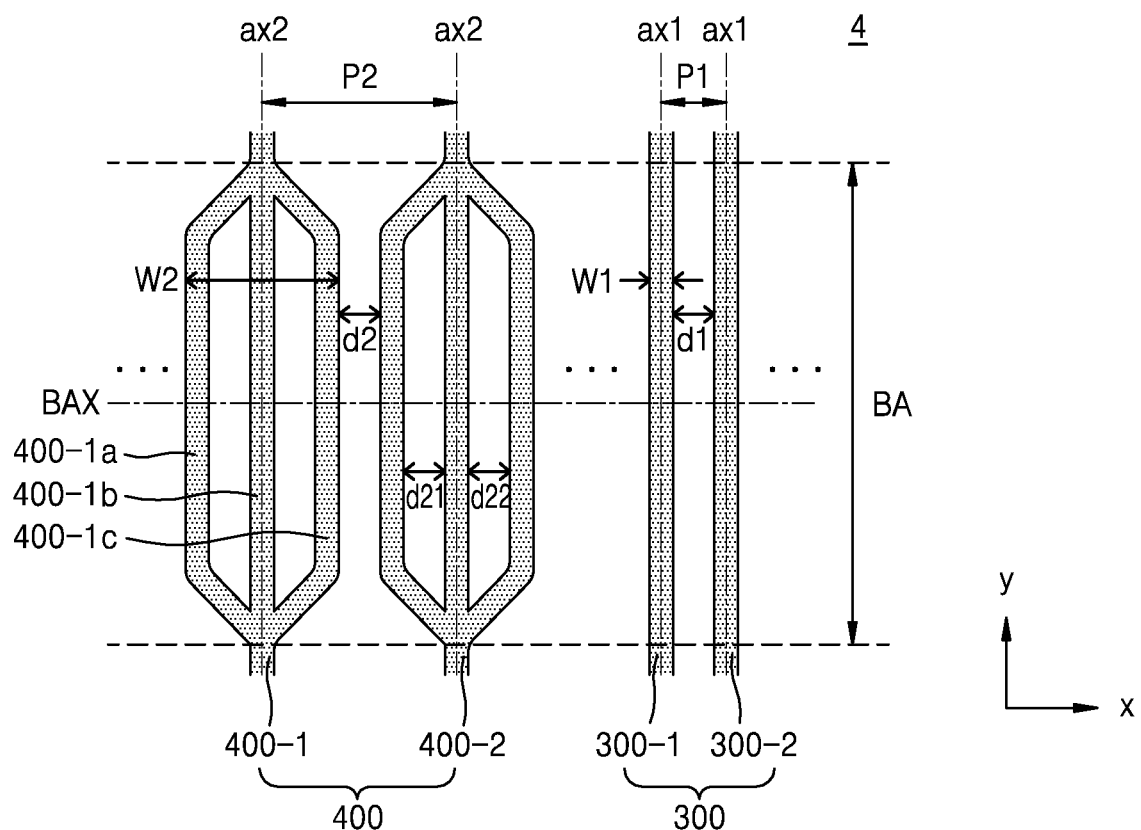
FIG. 6 is a schematic enlarged plan view of a part of a display device according to another exemplary embodiment of the present invention.

FIG. 5 is a schematic enlarged plan view of a part of a display device according to another exemplary embodiment of the present invention. FIG. 6 is a schematic enlarged plan view of a part of a display device according to another exemplary embodiment of the present invention. FIGS. 5 and 6 schematically illustrate enlarged parts of the first wiring unit 300 and the second wiring unit 400 in the bending area BA.

Referring to FIG. 5, the first wiring unit 300 may include the first wirings 300-1 and 300-2. The first wirings 300-1 and 300-2 may respectively extend in one direction along the first central axes ax1. The second wiring unit 400 may include the second wirings 400-1 and 400-2. The second wirings 400-1 and 400-2 may respectively extend in one direction along the second central axes ax2. Each of the first central axes ax1 and the second central axes ax2 may cross the bending axis BAX. According to an exemplary embodiment of the present invention, each of the first central axes ax1 and the second central axes ax2 may be perpendicular to the bending axis BAX. The bending axis BAX may be formed in the X axis direction, and the first central axes ax1 and the second central axes ax2 may be formed along the Y axis direction perpendicular to the X axis. According to an exemplary embodiment of the present invention, the first central axes ax1 and the second central axes ax2 may be formed in a diagonal direction crossing the X axis.

Each of the second central axes ax2 may be located along the direction crossing the bending axis BAX. According to an exemplary embodiment of the present invention, each of the second central axes ax2 may be perpendicular to the bending axis BAX. For example, the bending axis BAX may be formed in the X axis direction, and the second central axes ax2 may be formed along the Y axis direction perpendicular to the X axis. According to an exemplary embodiment of the present invention, the second central axes ax2 may be formed in a diagonal direction crossing the X axis. The first central axes ax1 and the second central axes ax2 may extend in different directions.

Referring to FIG. 5, the first wirings 300-1 and 300-2 and the second wirings 400-1 and 400-2 may be substantially parallel with each other in some areas. That is, the first wirings 300-1 and 300-2 and the second wirings 400-1 and 400-2 may sequentially extend over the first area 1A, the bending BA, and the second area 2A of the substrate 100. The first wirings 300-1 and 300-2 and the second wirings 400-1 and 400-2 may be substantially parallel with each other in the bending area BA.

According to an exemplary embodiment of the present invention, each of the second wirings 400-1 and 400-2 may include a first sub wiring 400-1a and a second sub wiring 400-1b that are electrically connected to each other. The first sub wiring 400-1a and the second sub wiring 400-1b may be spaced apart from each by a predetermined space, and thus the first sub wiring 400-1a and the second sub wiring 400-1b may be connected in parallel to each other. The first sub wiring 400-1a and the second sub wiring 400-1b may be positioned only in the bending area BA and might not extend over the first area 1A and the second area 2A in relation to the bending area BA. For example, the second wiring 400-1 may include the first sub wiring 400-1a and the second sub wiring 400-1b in the bending area, and the second wiring 400-1 may be a single wiring in the first area 1A and the second area A2. A distance d21 between the first sub wiring 400-1a and the second sub wiring 400-1b may be substantially the same as a distance between the first wirings 300-1 and 300-2 but exemplary embodiments of the present invention are not limited thereto. The distance d21 between the first sub wiring 400-1a and the second sub wiring 400-1b may refer to a distance between facing edges of each of the sub wirings that are most adjacent to each other among a plurality of sub wirings 400-1a, 400-2a.

According to an exemplary embodiment of the present invention, each of the second wirings 400-1 and 400-2 may include the plurality of sub wirings 400-1a, 400-1b, ... in the bending area BA. The plurality of sub wirings 400-1a, 400-1b, ... may be combined as a single wiring in the first area 1A and the second area 2A. That is, each of the first sub wiring 400-1a and the second sub wiring 400-1b may have a single wiring shape like the first wirings 300-1 and 300-2 in the first area 1A and the second area 2A and then may split into several wirings in the bending area BA. Thus, tensile stress of the second wiring unit 400 positioned in the bending area BA may be reduced and resistance of the second wiring unit 400 may be reduced through a parallel connection of the plurality of sub wirings 400-1a, 400-1b, ....

According to an exemplary embodiment of the present invention, the first central axes ax1 included in the first wirings 300-1 and 300-2 may be spaced apart from each other by the first pitch P1, and the second central axes ax2 included in the second wirings 400-1 and 400-2 may be spaced apart from each other by the second pitch P2. The second pitch P2 may be greater than the first pitch P1. The plurality of second wirings 400-1 and 400-2 may be spaced apart from each other by a pitch greater than the first wirings 300-1 and 300-2. The first pitch P may refer to a space between the first central axes ax1 of the first wirings 300-1 and 300-2 that are most adjacent to each other. The second pitch P2 may refer to a space between the second central axes ax2 of the second wirings 400-1 and 400-2 that are most adjacent to each other.

According to an exemplary embodiment of the present invention, the second pitch P2 may be n times (e.g., n≥2) of the first pitch P1. That is, the second pitch P2 of the second wirings 400-1 and 400-2 may increase by a multiple of the first pitch P1 of the first wirings 300-1 and 300-2 and may increase by a multiple of a natural number except 1.

According to an exemplary embodiment of the present invention, the second pitch P2 may be 2 times or more the first pitch P1. That is, the second pitch P2 of the second wirings 400-1 and 400-2 may be 2 times or more the first pitch P of the first wirings 300-1 and 300-2 and need not increase by a multiple of the first pitch P1. The second pitch P2 of the second wirings 400-1 and 400-2 may be 2*a (e.g., a≥1) of the first pitch P1 of the first wirings 300-1 and 300-2 and "a" may be a rational number equal to or greater than 1. Thus, wirings may be disposed over the substrate 100.

According to an exemplary embodiment of the present invention, each of the first wirings 300-1 and 300-2 may have the first width w1, and each of the second wirings 400-1 and 400-2 may have the second width w2. A width may be a thickness recognizable on a plane (e.g., the X-Y plane) and may refer to a distance from one side end of a wiring to another side end of the wire in relation to a central axis of the wiring. The second width w2 of each of the second wirings 400-1 and 400-2 may be greater than the first width w1 of each of the first wirings 300-1 and 300-2.

Each of the second wirings 400-1 and 400-2 may be may include multiple sub wirings, and thus the second width w2 of each of the second wirings 400-1 and 400-2 may be greater than the first width w1 of each of the first wirings 300-1 and 300-2 formed in a single line. The second width w2 of each of the second wirings 400-1 and 400-2 may be greater than the first width w1 of each of the first wirings 300-1 and 300-2, and thus the second pitch P2 of the second wirings 400-1 and 400-2 may be greater than the first pitch P1 of the first wirings 300-1 and 300-2.

Each of the second wirings 400-1 and 400-2 may include sub wirings, which may increase the second pitch P2 of the second wirings 400-1 and 400-2. The sub wirings may be electrically connected in parallel to each other, and thus the resistance of each of the second wirings 400-1 and 400-2 may be less than the resistance of each of the first wirings 300-1 and 300-2. The second wiring unit 400 may include a power wiring unit and a driving circuit wiring unit, and thus the resistance of the second wiring unit 400 may be reduced, thus providing power and driving signals to each pixel of a display and accordingly increasing the quality of the display.

According to an exemplary embodiment of the present invention, the first wirings 300-1 and 300-2 may be spaced apart from each other by the first distance d1, and the second wirings 400-1 and 400-2 may be spaced apart from each other by the second distance d2. The first wirings 300-1 and 300-2 may be spaced apart from each other by the first distance d1, and d1 may refer to a distance between facing edges of each of two wirings that are most adjacent to each other among the plurality of the first wirings 300-1, 300-2, . . . . This may also apply to the second wirings 400-1 and 400-2 that are spaced apart from each other by the second distance d2. In case of the second wirings 400-1 and 400-2, a distance between facing edges of each of two wirings that are most adjacent to each other among the plurality of the second wirings 400-1, 400-2, . . . is the second distance d2.

The first distance d1 and the second distance d2 may be substantially the same. The second distance d2 between the second wirings 400-1 and 400-2 may be substantially the same as the first distance d1 between the first wirings 300-1 and 300-2. Even if a width of each of the second wirings 400-1 and 400-2 increases, a minimum distance between the second wirings 400-1 and 400-2 may be maintained, thus reducing or eliminating shorts between wirings.

FIG. 6 is a schematic enlarged plan view of a part of a display device according to another exemplary embodiment of the present invention. FIG. 6 illustrates a modification of an exemplary embodiment of the present invention described with reference to FIG. 5 and is different from the exemplary embodiment of the present invention described with reference to FIG. 5 in a shape of the second wiring unit 400. The exemplary embodiment of the present invention described with reference to FIG. 6 may be substantially the same as the exemplary embodiment of the present invention described with reference to FIG. 5 except for the shape of the second wiring unit 400, and thus redundant descriptions may be omitted.

Referring to FIG. 6, a shape of each of the second wirings 400-1 and 400-2 of the second wiring unit 400 may include a third sub wiring 400-1c. Each of the second wirings 400-1 and 400-2 may include the first sub wiring 400-1a, the second sub wring 400-1b, and the third sub wiring 400-1c.

The first central axes ax1 included in the first wirings 300-1 and 300-2 may be spaced apart from each other by the first pitch P1, and the second central axes ax2 included in the second wirings 400-1 and 400-2 may be spaced apart from each other by the second pitch P2. The second pitch P2 may be greater than the first pitch P1. The plurality of second wirings 400-1 and 400-2 may be spaced apart from each other by a pitch greater than the first wirings 300-1 and 300-2.

The third sub wiring 400-1c may be added compared to the exemplary embodiment of the present invention described with reference to FIG. 5, and thus the second pitch P2 between the second wirings 400-1 and 400-2 may be increased. Sub wirings may be added to each of the second wirings 400-1 and 400-2, and thus a width of the second pitch P2 may be increased. Sub wirings that are connected in parallel to each other may be added, and thus the resistance of the second wiring unit 400 may be relatively lower than resistance of the first wiring unit 300. According to an exemplary embodiment of the present invention, the first wirings 300-1 and 300-2 may be spaced apart from each other by the first distance d1, and the second wirings 400-1 and 400-2 may be spaced apart from each other by the second distance d2 that is substantially the same as the first distance d1.

The distance d21 between the first sub wiring 400-1a and the second sub wiring 400-1b may be substantially the same as a distance between the first wirings 300-1 and 300-2 but exemplary embodiments of the present invention are not limited thereto. A distance d22 between the second sub wiring 400-1b and the third sub wiring 400-1c may be substantially the same as the distance between the first wirings 300-1 and 300-2 but exemplary embodiments of the present invention are not limited thereto. The distance d2l between the first sub wiring 400-1a and the second sub wiring 400-1b may be substantially the same as the distance d22 between the second sub wiring 400-1b and the third sub wiring 400-1c but exemplary embodiments of the present invention are not limited thereto. The distance d21 between the first sub wiring 400-1a and the second sub wiring 400-1b and the distance d22 between the second sub wiring 400-1b and the third sub wiring 400-1c may refer to a distance between facing edges of each of wrings that are most adjacent to each other among the plurality of sub wirings 400-1a, 400-2a, . . . .

The substrate 100 may be bent along the bending axis BAX in the bending area BA, and thus tensile stress may be applied to the plurality of first wirings 300-1, 300-2, . . . and the plurality of second wirings 400-1, 400-2, . . . in the bending area BA. The first wiring unit 300 including data wirings may include a relatively large number of channels. The second wiring unit 400 including the power wiring unit and the driving circuit wiring unit may include relatively fewer channels than the first wiring unit 300. Thus, the substrate 100 may be bent in the bending area BA, and tensile stress may be applied to the first wiring unit 300 and the second wiring unit 400, which may cause cracks or defects due to disconnections in the plurality of first wirings 300-1, 300-2, . . . of the first wiring unit 300 and the plurality of second wirings 400-1, 400-2, . . . of the second wiring unit 400.

Since the second wiring unit 400 may include relatively fewer channels than the first wiring unit 300, a disconnection of one wiring may result in a fatal defect in the display. Since the second wiring unit 400 includes the power wiring unit and the driving circuit wiring unit, when a defect or a disconnection occurs in a power wiring or a driving circuit wiring, there may be a fatal defect where power is not supplied to the display or a signal is not applied to a driving signal for driving the display.

The display device according to an exemplary embodiment of the present invention may have a pitch between the plurality of second wirings 400-1, 400-2, . . . of the second wiring unit 400 greater than a pitch between the plurality of first wirings 300-1, 300-2, . . . of the first wiring unit 300. The second pitch P2 between the plurality of second wirings 400-1, 400-2, . . . may be greater than the first pitch P1 between the plurality of first wirings 300-1, 300-2, . . . , which may reduce a tensile stress applied to the second wiring unit 400 in the bending area BA of the substrate 100.

Figure 7:
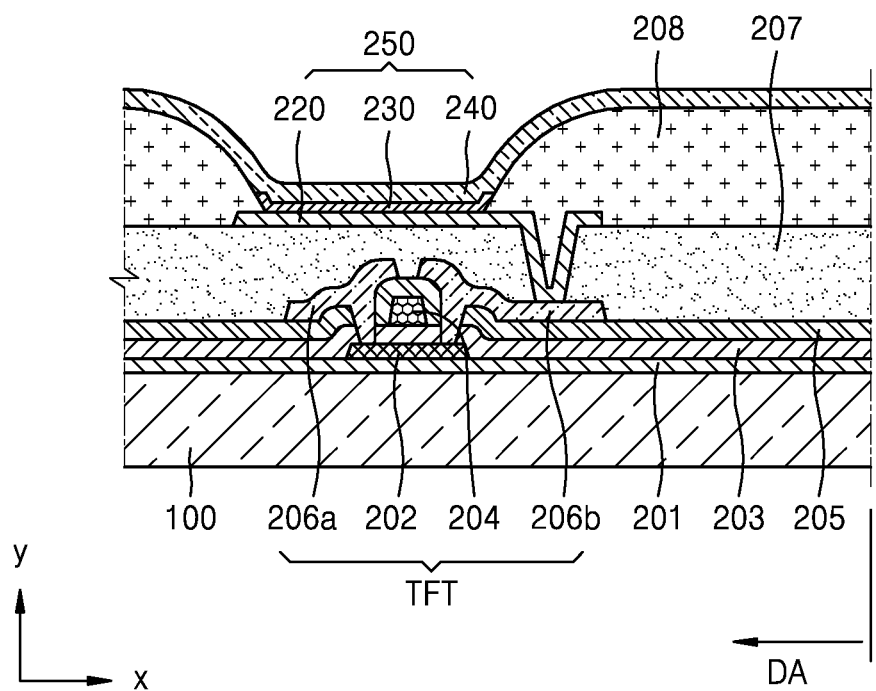
FIG. 7 is a cross-sectional view of a part of the display device of FIG. 1.

FIG. 7 is a cross-sectional view of a part of the display device of FIG. 1.

FIG. 7 illustrates a pixel structure of the display 200 included in the display device described with reference to FIG. 1. Although an organic light-emitting device (OLED) is employed as a display device 250 of the display 200, according to another exemplary embodiment of the present invention, an inorganic light-emitting device such as a liquid crystal device or an inorganic light-emitting device ILED may be employed.

The display 200 may include a thin film transistor TFT to which the display device 250 is electrically connected, in addition to the display device 250. The OLED may be disposed in the display 200 as the display device 250. Electrically connecting the OLED to the thin film transistor TFT may include electrically connecting a pixel electrode 220 to the thin film transistor TFT. The thin film transistor TFT may be disposed in the non-display area NDA outside the display area DA of the substrate 100. The thin film transistor TFT disposed in the non-display area NDA may be, for example, a part of a circuit unit for controlling an electrical signal applied to the display 200.

A buffer layer 201 including a silicon oxide, or a silicon nitride, for example, may be disposed over the substrate 100. A semiconductor layer 202 may be disposed on the buffer layer 201. The buffer layer 201 may planarize a surface of the substrate 100 or may reduce or prevent impurities from penetrating into the semiconductor layer 202 of the thin film transistor TFT.

A gate electrode 204 may be disposed over the semiconductor layer 202. A source electrode 206a and a drain electrode 206b may be electrically connected to each other according to a signal applied to the gate electrode 204. The gate electrode 204 may include one or more materials of, for example, aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu) in a single-layered or multi-layered structure, in consideration of adhesion to adjacent layers, surface smoothness of stacked layers, and processability.

A gate insulating layer 203 including a silicon oxide and/or a silicon nitride may be disposed between the semiconductor layer 202 and the gate electrode 204. The gate insulating layer 203 may insulate the semiconductor layer 202 and the gate electrode 204 from each other.

An interlayer insulating layer 205 may be disposed above the gate electrode 204 and may include a silicon oxide, or a silicon nitride, for example, in a single-layered or multi-layered structure.

The source electrode 206a and the drain electrode 206b may be disposed on the interlayer insulating layer 205. The source electrode 206a and the drain electrode 206b may be electrically connected to the semiconductor layer 202 via respective contact holes formed in both of the interlayer insulating layer 205 and the gate insulating layer 203. The source electrode 206a and the drain electrode 206b may include one or more materials of, for example, aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu) in a single-layered or multi-layered structure, in consideration of conductivity or the like.

A protective layer may cover the thin film transistor TFT and may protect the thin film transistor TFT. The protective layer may include an inorganic material such as silicon oxide, silicon nitride, or silicon oxynitride.

A planarization layer 207 may be disposed over the substrate 100. The planarization layer 207 may be a protective layer. When an OLED is disposed over the thin film transistor TFT, the planarization layer 207 may generally planarize an upper surface of the thin film transistor TFT and protect the thin film transistor TFT and various devices. The planarization layer 207 may include, for example, an acryl-based organic material, or benzocyclobutene (BCB). The buffer layer 201, the gate insulating layer 203, the interlayer insulating layer 205, and the planarization layer 207 may be formed over substantially the entire surface of the substrate 100.

A pixel defining layer 208 may be disposed above the thin film transistor TFT. The pixel defining layer 208 may be disposed on planarization layer 207 and may have an aperture. The pixel defining layer 208 may define a pixel area on the substrate 100.

The pixel defining layer 208 may include, for example, an organic insulating layer. The organic insulating layer may include an acryl-based polymer such as polymethyl methacrylate (PMMA), polystyrene (PS), a polymer derivative having a phenol group, an imide-based polymer, an acryl ether-based polymer, an amide-based polymer, a fluorine-based polymer, a p-xylene-based polymer, a vinyl alcohol-based polymer, or a mixture of these materials.

The display device 250 may be disposed above the planarization layer 207. The display device 250 may include the pixel electrode 220, an intermediate layer 230 including an emission layer (EML), and an opposite electrode 240.

The pixel electrode 220 may include a transparent (or semi-transparent) electrode or a reflective electrode. When the pixel electrode 220 includes the transparent (or semi-transparent) electrode, the pixel electrode 220 may include, for example, indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 220 includes the reflective electrode, the pixel electrode 220 may include a reflective layer including silver (Ag), magnesium (Mg), aluminum (A), platinum (Pt), palladium (Pd), gold (Au), nickel (Ni), neodymium (Nd), iridium (Ir), chromium (Cr), or a combination thereof, and a layer including ITO, IZO, ZnO, $In_2O_3$, IGO, or AZO. However, exemplary embodiments of the present invention are not limited thereto. The pixel electrode 220 may include various other materials and may have various other structures, such as, a single-layered or multi-layered structure.

The intermediate layer 230 may be disposed in the pixel area defined by the pixel defining layer 208. The intermediate layer 230 may include the emission layer (EML) emitting light according to an electrical signal, and may include a hole injection layer (HIL) and a hole transport layer (HTL), an electron transport layer (ETL) disposed between the EML and the pixel electrode 220, and an electron injection layer (EIL) between the EML and the opposite electrode 240, in a single or complex stack structure but exemplary embodiments of the present invention are not limited thereto. The intermediate layer 230 may have various other structures.

The opposite electrode 240 that covers the intermediate layer 230 including the EML and faces the pixel electrode 220 may be disposed over substantially the entire surface of the substrate 100. The opposite electrode 240 may include a transparent (or semi-transparent) electrode or a reflective electrode.

When the opposite electrode 240 includes the transparent (or semi-transparent) electrode, the opposite electrode 240 may include a layer including a metal having a relatively small work function, for example, Li, Ca, LiF/Ca, LiF/Al, Al, Ag, Mg, or a combination thereof, and a transparent (or semi-transparent) conductive layer including ITO, IZO, ZnO, or $In_2O_3$. When the opposite electrode 240 includes the reflective electrode, the opposite electrode 240 may include a layer including Li, Ca, LiF/Ca, LiF/Al, Al, Ag, Mg, or a combination thereof. The configuration and materials of the opposite electrode 240 are not limited to those described herein, and may have various modifications.

According to some exemplary embodiments of the present invention, functional layers, such as an encapsulation layer, a polarization layer, and a color filter, may be disposed above the opposite electrode 240.

Figure 8:
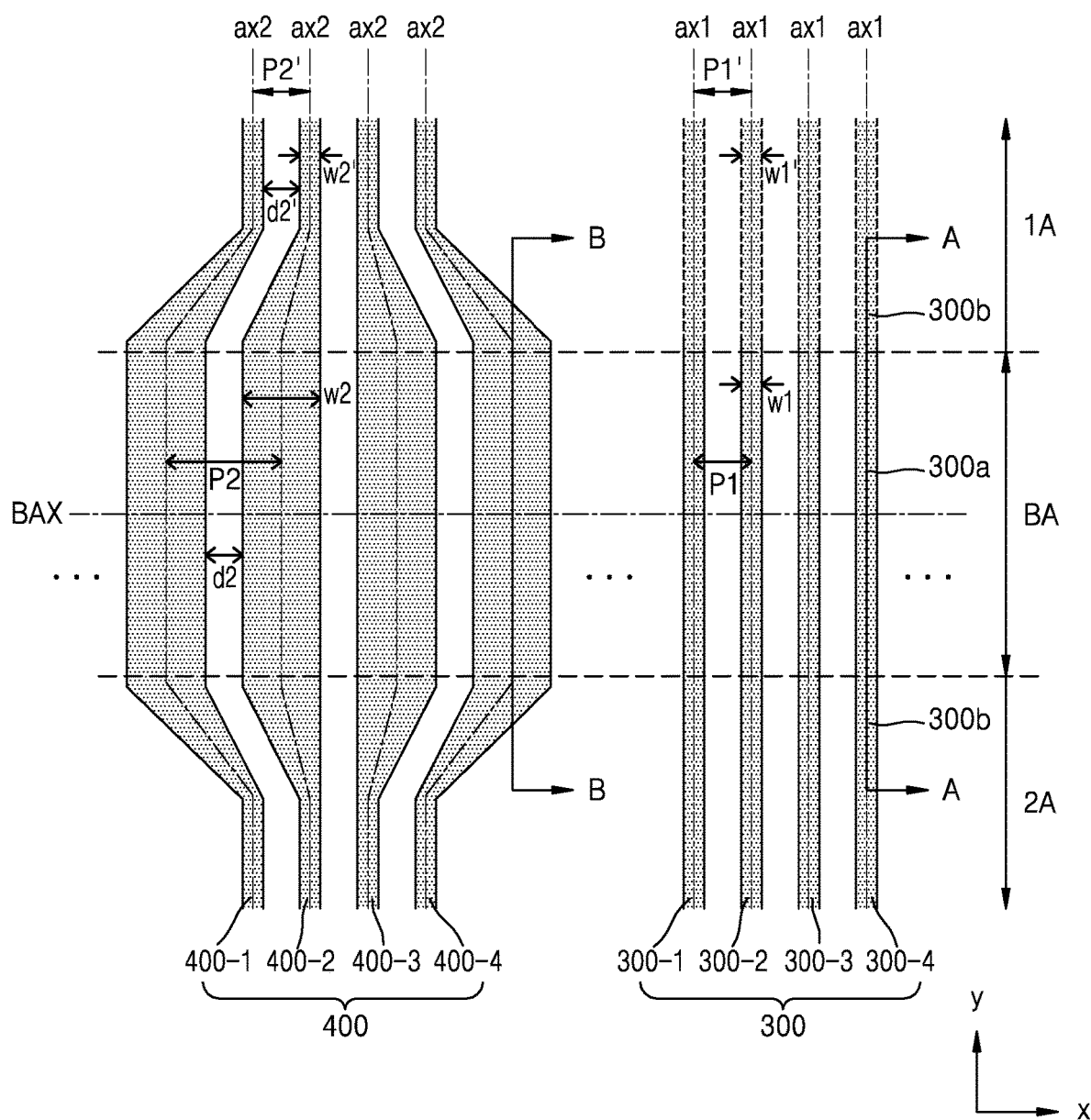
FIG. 8 is a schematic plan view of a part of the display device of FIG. 1.

FIG. 8 is a schematic plan view of a part of the display device of FIG. 1. FIG. 8 illustrates a shape in which the first wiring unit 300 and the second wiring unit 400 are disposed in the first area 1A, the bending area BA, and the second area 2A of the substrate 100.

Referring to FIG. 8, the first wiring unit 300 and the second wiring unit 400 in the bending area BA may be substantially the same as those described above. That is, in the first wiring unit 300 and the second wiring unit 400 in the bending area BA, the first wiring unit 300 may have the first pitch P1 and the second wiring unit 400 may have the second pitch P2 greater than the first pitch P1. A width of each of the plurality of second wirings 400-1, 400-2, 400-3, 400-4, . . . may be greater than a width of each of the first wirings 300-1, 300-2, 300-3, 300-4, . . . .

The first wiring unit 300 and the second wiring unit 400 that are positioned in the first area 1A and the second area 2A except for the bending area BA may each respectively have a third pitch P1' and a fourth pitch P2'. The third pitch P1' and the fourth pitch P2' may be substantially the same.

In the second wiring unit 400, the plurality of second wirings 400-1, 400-2, 400-3, 400-4, . . . may have the second pitch P2 in the bending area BA and the fourth pitch PT in the first area 1A and the second area 2A. A change in a pitch of the plurality of second wirings 400-1, 400-2, 400-3, 400-4, . . . from the second pitch P2 to the fourth pitch P2' smaller than the second pitch P2, may reduce a width in each of the of the plurality of second wirings 400-1, 400-2, 400-3, 400-4, . . . from the second width w2 to a fourth width w2'. However, in this case, the distance d2 between the plurality of second wirings 400-1, 400-2, 400-3, 400-4, . . . in the bending area BA may be substantially the same as a distance d2' between the plurality of second wirings 400-1, 400-2, 400-3, 400-4, . . . in the first area 1A and the second area 2A. The distances d2 and d2' between the plurality of second wirings 400-1, 400-2, 400-3, 400-4, . . . may refer to distances between facing edges of each of wirings that are most adjacent to each other among the plurality of second wirings 400-1, 400-2, 400-3, 400-4, . . . .

In the first wiring unit 300, the plurality of first wirings 300-1, 300-2, 300-3, 300-4, . . . may have the first pitch P1 in the bending area BA and the third pitch P1' that is substantially the same as the first pitch P1 in the first area 1A and the second area 2A. The same pitch between the plurality of first wirings 300-1, 300-2, 300-3, 300-4, . . . in the first area 1A, the bending area BA, and the second area 2A may refer to the first width w1 being substantially the same as a third width w1' of the plurality of first wirings 300-1, 300-2, 300-3, 300-4, . . . .

The second wiring unit 400 may also have substantially the same pitch as the first wiring unit 300 in the first area 1A and the second area 2A except for the bending area BA. However, a pitch of the second wiring unit 400 may increase from the fourth pitch P2' to the second pitch P2 in the bending area BA and thus a width of each of the plurality of second wirings 400-1, 400-2, 400-3, 400-4, . . . may also increase. An area in which the first area 1A and the bending area BA contact each other and an area in which the second area 2A and the bending area BA contact each other may broaden or narrow to have a fan-out shape since the pitch of the second wiring unit 400 may change.

The second wiring unit 400 may include a same material as the source electrode 206a or the drain electrode 206b of the thin film transistor TFT in the entire area of the substrate 100. The first wiring unit 300 may include a same material as the gate electrode 300 of the thin film transistor TFT in the first area 1A and the second area 2A and may include a same material as the source electrode 206a or the drain electrode 206b of the thin film transistor TFT in the bending area BA.

Figure 9:
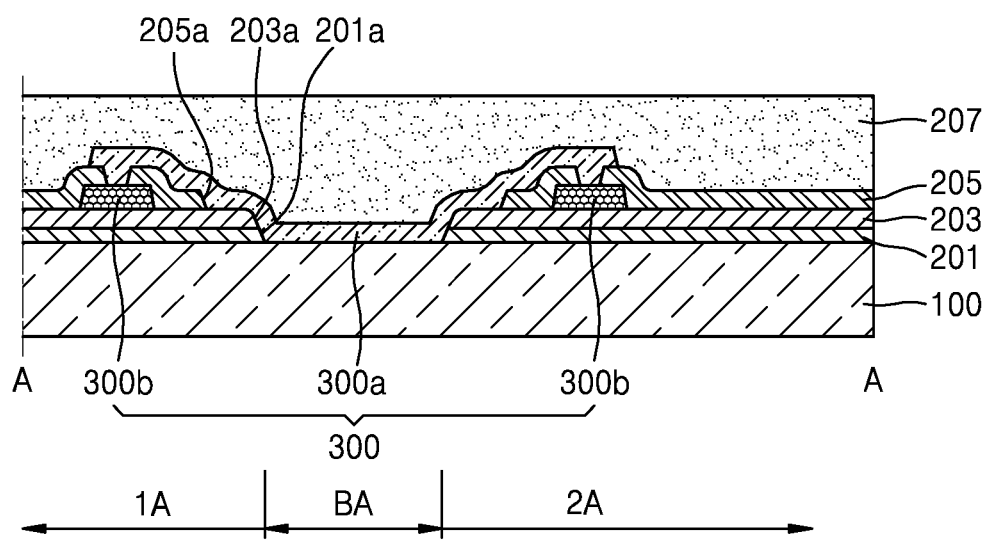
FIG. 9 is a schematic cross-sectional view taken along a line A-A of FIG. 8.

FIG. 9 is a schematic cross-sectional view taken along a line A-A of FIG. 8.

FIG. 9 illustrates the non-display area NDA of one side of the display 200. The non-display area NDA may include the first area 1A, the bending area BA, and the second area 2A. FIG. 9 is a cross-sectional view of the first wiring unit 300. The first wiring unit 300 may be one first wiring of the plurality of first wirings 300-1, 300-2, . . . included in the first wiring unit 300.

Referring to FIG. 9, the buffer layer 201, the gate insulating layer 203, and the interlayer insulating layer 205 that include an inorganic material may be referred to as an inorganic insulating layer. The inorganic insulating layer may be disposed over substantially the entire surface of the substrate 100 and may have an aperture corresponding to the bending area BA. The buffer layer 201, the gate insulating layer 203, and the interlayer insulating layer 205 may respectively have apertures 201a, 203a, and 205a corresponding to the bending area BA. The apertures may overlap the bending area BA. An area of an aperture may be greater than an area of the bending area BA. A width of the aperture may be greater than a width of the bending area BA. The area of the aperture may be defined as an area of an aperture having the smallest area among the apertures 201a, 203a, and 205a of the buffer layer 201, the gate insulating layer 203, and the interlayer insulating layer 205. Referring to FIG. 8, the area of the aperture may be defined by an area of the aperture 201a of the buffer layer 201. An inner surface of the aperture 201a of the buffer layer 201 and an inner surface of the aperture 203a of the gate insulating layer 203 may e substantially identical to each other; however, exemplary embodiments of the present invention are not limited thereto.

The first wiring unit 300 may be disposed over the first area 1A, the bending area BA, and the second area 2A to cover the apertures 201a, 203a, and 205a. The first wiring unit 300 may include a first conductive layer 300a and a second conductive layer 300b. The first conductive layer 300a may be positioned in the bending area BA, and the second conductive layer 300b may be positioned in the first area 1A and the second area 2A. The first conductive layer 300a and the second conductive layer 300b may be electrically connected to each other via a contact hole.

The first conductive layer 300a may be positioned over the bending area BA, may cover the apertures 201a, 203a, and 205a and may extend to the first area 1A and the second area 2A. A part of the substrate 100 may be exposed to the outside through the aperture 201a of the buffer layer 201 and the aperture 203a of the gate insulating layer 203, and thus the first conductive layer 300a may directly contact the substrate 100 through the apertures 201a and 203a. However, an inorganic insulating layer or an organic insulating layer may be further disposed between the first conductive layer 300a and the substrate 100.

The second conductive layer 300b may be positioned in the first area 1A and the second area 2A. The first conductive layer 300a and the second conductive layer 300b may be insulated by the interlayer insulating layer 205 and may be electrically connected through the contact hole. The second conductive layer 300b may further extend to the first area 1A and the second area 2A. The second conductive layer 300b may be positioned outside the display area DA and may be electrically connected to elements positioned in the display area DA. The second conductive layer 300b may be positioned outside the display area DA and may extend in a direction of the display area DA and may be at least partially positioned in the display area DA.

The first conductive layer 300a may include a same material as the source electrode 206a or the drain electrode 206b of the thin film transistor TFT and may be formed substantially simultaneously with the source electrode 206a or the drain electrode 206b. The second conductive layer 300b may include a same material as the gate electrode 204 of the thin film transistor TFT and may be formed substantially simultaneously with the gate electrode 204. The source electrode 206a or the drain electrode 206b of the thin film transistor TFT may include a relatively more flexible metal than the gate electrode 204.

If the first wiring unit 300 does not include the first conductive layer 300a and the second conductive layer 300b and includes a wiring of a single layer, maximum tensile stress may be applied to a part of the first wiring unit 300 positioned in the bending area BA, and a crack and a disconnection may occur. In the display device according to an exemplary embodiment of the present invention, the first wiring unit 300 may include the first conductive layer 300a and the second conductive layer 300b, and the first conductive layer 300a positioned in the bending area BA may include a same material as the source electrode 206a or the drain electrode 206b having relatively high flexibility. Thus, the tensile stress applied to the first wiring unit 300 may be reduced.

Referring to FIG. 9, an inorganic insulating layer corresponding to the bending area BA may have an aperture. If the inorganic insulating layer is continuously disposed over the bending area BA, a crack may occur in the inorganic insulating layer positioned in the bending area BA during a process of bending the substrate 100 in the bending area BA, which may cause a defect such as a disconnection of the first wiring unit 300 positioned over the inorganic insulating layer. In the display device according to an exemplary embodiment of the present invention, the inorganic insulating layer may overlap with the bending area BA to have an aperture, and the first conductive layer 300a may be disposed to cover the aperture, thus reducing or eliminating defects in the first wiring unit 300 due to bending of the substrate 100.

The substrate 100 of the display device according to an exemplary embodiment of the present invention may be bent in the bending area BA. The display device may be manufactured to have the substrate 100 in an approximately flat state, and then the display device may be bent by bending the substrate 100 in the bending area BA. Although tensile stress may be applied to the first wiring unit 300 or the second wiring unit 400 during the process of bending the substrate 100 in the bending area BA, the display device according to an exemplary embodiment of the present invention may reduce or prevent an occurrence of a defect in the first wiring unit 300 and the second wiring unit 400.

Figure 10:
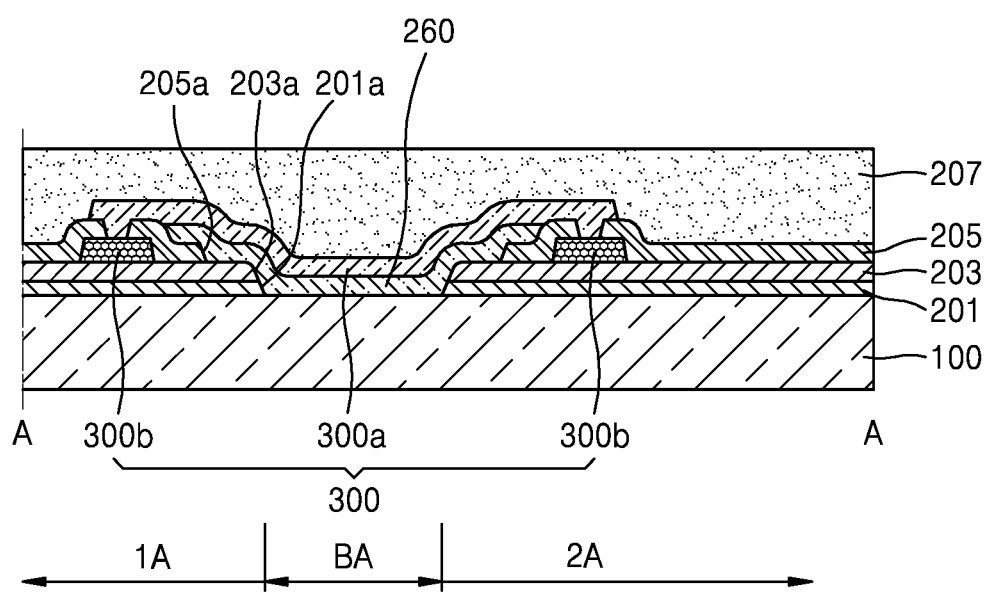
FIG. 10 is a schematic cross-sectional view of a part of a display device according to another exemplary embodiment of the present invention.

FIG. 10 is a schematic cross-sectional view of a part of a display device according to another exemplary embodiment of the present invention.

The exemplary embodiment of the present invention described with reference to FIG. 10 may be substantially the same as the exemplary embodiment of the present invention described with reference to FIG. 8 except that an organic layer 260 may be disposed between the substrate 100 and the first conductive layer 300a in the bending area BA, and thus redundant descriptions may be omitted.

Referring to FIG. 10, the organic insulating layer 260 may be disposed over the bending area BA, and over parts of the first area 1A and the second area 2A. The organic insulating layer 260 may cover an aperture of the inorganic insulating layer. Since the substrate 100 may be bent in the bending area BA, tensile stress may be applied to the first wiring unit 300 and/or the second wiring unit 400 positioned in the bending area BA. In the display device, the aperture may be formed in the inorganic insulating layer to correspond to the bending area BA and then the organic layer 260 may be disposed to cover the aperture, and the first conductive layer 300a may be disposed over the organic layer 260. Thus, the organic layer 260 disposed in the bending area BA may effectively distribute stress applied to the first conductive layer 300a and may reduce or prevent an occurrence of cracks in the first conductive layer 300a.

According to an exemplary embodiment of the present invention, an upper surface of the organic layer 260 may be uneven and may have a wave pattern shape. An uneven structure of the upper surface of the organic layer 260 may increase a distribution of stress when the bending area BA is bent.

Figure 11:
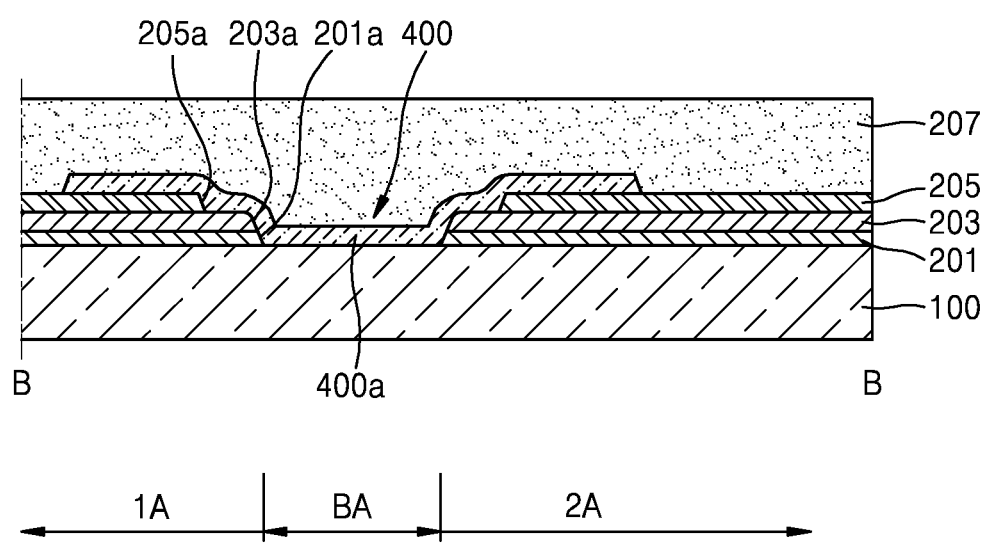
FIG. 11 is a schematic cross-sectional view of a part of a display device according to another exemplary embodiment of the present invention.

FIG. 1 is a schematic cross-sectional view of a part of a display device according to another exemplary embodiment of the present invention. FIG. 11 is a cross-sectional view of the second wiring unit 400 of FIG. 8 taken along a line B-B.

Referring to FIGS. 8 and 11, the buffer layer 201, the gate insulating layer 203, and the interlayer insulating layer 205 that are inorganic insulating layers may respectively have the apertures 201a, 203a, and 205a corresponding to the bending area BA. The second wiring unit 400 may be disposed over the first area 1A, the bending area BA and the second area 2A to cover the apertures 201a, 203a, and 205a. The second wiring unit 400 may include a third conductive layer 400a. The third conductive layer 400a may include a same material as the second wiring unit 400 and may be integrally formed with the second wiring unit 400.

Figure 12:
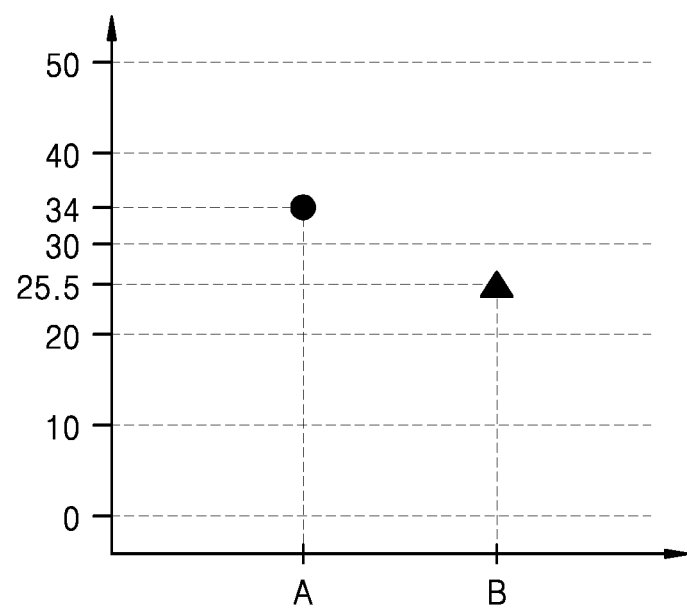
FIG. 12 is a graph showing bending of a display device according to an exemplary embodiment of the present invention.

FIG. 12 is a graph showing bending of a display device according to an exemplary embodiment of the present invention.

The graph of FIG. 12 shows a number of times two samples having different pitches between wirings are bent before two wirings are disconnected. The x axis of the graph indicates two wirings having different pitches, and the Y axis of the graph indicates the number of times the wirings are bent.

Referring to FIG. 12, a first sample A is set to have a pitch between two wirings at about 60 μm, and a width of each of the two wirings at about 48 µm, whereas a second sample B is set to have a pitch between two wirings at about 18 µm, and the width of each of the two wirings at about 13 µm in the present test. That is, the first sample A is set to have a pitch and a width that is about 3 times greater than the second sample B. Forming and bending the first sample A and the second sample B over a substrate may occur under the same conditions.

Referring to FIG. 12, the two wirings of the first sample A are disconnected at a 34 times bending, whereas the two wirings of the second sample B are disconnected at 25.5 times bending. That is, the first sample A that is set to have a pitch between two wirings at about 60 µm, and the width of each of the two wirings at about 48 µm is stronger against tensile stress applied when bent than the second sample B that is set to have a pitch between two wirings at about 18 µm and the width of each of the two wirings at about 13 µm. Thus, increased pitch between wirings may result in increased bending characteristics and a decrease in separation between wirings.

The display device according to exemplary embodiments of the present invention may reduce or eliminate an occurrence of defects, such as a disconnection, during manufacturing of the display device while increasing a lifespan of the display device may. However, the scope of the exemplary embodiments of the present invention is not restricted by this effect.

While one or more embodiments have been described with reference to the figures, it will be understood by those of ordinary skill in the art that various changes in form and details may be made therein without departing from the spirit and scope as defined by the following claims.

What is claimed is:

1. A display device comprising:
   a substrate including a bending area in which the substrate is bent;
   a first wiring unit comprising a plurality of first wirings arranged across the bending area of the substrate,
   a second wiring unit comprising a plurality of second wirings arranged across the bending area of the substrate,
   wherein each of the plurality of first wirings is a single wiring in the bending area, and
   wherein each of the plurality of second wirings is branched into a plurality of sub wirings in the bending area.

2. The display device of claim 1, wherein the substrate includes a first area and a second area, and the bending area is located between the first area and the second area,
   wherein each of the plurality of second wirings is arranged in the first area and the second area as a single wiring.

3. The display device of claim 1, wherein each of the plurality of second wirings comprises a first sub wiring and a second sub wiring that are spaced apart from each other by a predetermined distance in the bending area, and the first sub wiring and the second sub wiring are electrically connected to each other.

4. The display device of claim 3, wherein the first sub wiring and the second sub wiring are connected in parallel to each other.

5. The display device of claim 3, wherein each of the plurality of second wirings further comprises a third sub wiring spaced apart from the second sub wiring by a predetermined distance, and
   wherein the second sub wiring and the third sub wiring are electrically connected to each other.

6. The display device of claim 1, wherein the plurality of sub wirings arranged in the bending area are spaced apart from each other by substantially the same distance.

7. The display device of claim 6, wherein the plurality of first wirings are spaced apart from each other by a first distance, and the plurality of sub wirings are spaced apart from each other by a second distance that is substantially the same as the first distance.

8. The display device of claim 1, Wherein each of the second wirings of the plurality of second wirings are symmetrical to each other with respect to each of the plurality of second central axes.

9. The display device of claim 1, further comprising:
   a display disposed over the substrate; and
   a driver disposed around the display and configured to drive the display,
   wherein the first wiring unit is a power supply wiring unit is configured to supply power to the driver or the display, and
   wherein the second wiring unit is a data signal wiring unit configured to provide a data signal to the display.

10. The display device of claim 1, wherein the plurality of first wirings and the plurality of sub wirings are substantially parallel with each Other.

11. The display device of claim 1, wherein the plurality of first wirings and the plurality of sub wirings extend in a direction crossing the bending axis.

12. The display device of claim 1, wherein first central axes in each of the plurality of first wirings are spaced apart from each other by a first pitch in the bending area, and
   wherein second central axes in each of the plurality of second wirings are spaced apart from each other by a second pitch different from the first pitch.

13. The display device of claim 12, wherein the second pitch is greater than the first pitch in the bending area.

14. The display device of claim 12, wherein the second pitch is n times as wide as the first pitch, wherein n≥2 and n is a natural number.

15. The display device of claim 12, wherein the second pitch is at least twice as wide as the first pitch.

16. The display device of claim 12, wherein the plurality of respective second central axes, of the plurality of second wirings are spaced apart from each other by a pitch less than the second pitch in, the first area and the second area.

17. The display device of claim 1, wherein resistance of each of the plurality of second wirings is less than resistance of each of the plurality of first wirings.

18. The display device of claim 1, further comprising a pad unit located over the second area of the substrate.

19. The display device of claim 1, the display device further comprising:
   a thin film transistor including a source electrode, a drain electrode, and a gate electrode,
   wherein the second wiring unit comprises a first conductive layer in the bending area and a second conductive layer in the first area and the second area,
   wherein the second conductive layer comprises a same material as the source electrode or the drain electrode, and the second conductive layer comprises a same material as the gate electrode.

20. The display device of claim 19, wherein the plurality of sub wirings comprises the first conductive layer.

21. The display device of claim 19, wherein the first conductive layer and the second conductive layer are electrically connected to each other via a contact hole.

* * * * *